(12) United States Patent
Kano

(10) Patent No.: US 6,622,379 B1
(45) Date of Patent: Sep. 23, 2003

(54) LIFT CAM MECHANISM FOR ELECTRONIC PARTS MOUNTING APPARATUS

(75) Inventor: Yoshinori Kano, Gunma-ken (JP)

(73) Assignee: Hitachi High-Tech Instruments Co., Ltd., Gunma-ken (JP)

( * ) Notice: Subject to any disclaimer, the term of this patent is extended or adjusted under 35 U.S.C. 154(b) by 0 days.

(21) Appl. No.: 09/534,416

(22) Filed: Mar. 23, 2000

Related U.S. Application Data

(62) Division of application No. 09/017,637, filed on Feb. 2, 1998, now Pat. No. 6,061,900.

(30) Foreign Application Priority Data

Jan. 31, 1997 (JP) .............................................. 9-32984

(51) Int. Cl.$^7$ ............................ B23P 19/00; F16H 25/16
(52) U.S. Cl. ............................ 29/740; 29/739; 29/743; 72/94; 72/210; 72/452.6; 74/56; 74/569; 74/567; 74/568 R; 74/55
(58) Field of Search ......................... 29/739, 740, 742, 29/741, 565, 832, 743; 72/94, 210, 452.6; 74/56, 569, 567, 568 FS, 568 R, 55

(56) References Cited

U.S. PATENT DOCUMENTS 5,544,411 A * 8/1996 Kano et al. .................... 29/740
5,575,059 A * 11/1996 Muroka et al. ................ 29/740
5,676,006 A * 10/1997 Marshall ..................... 72/452.6

FOREIGN PATENT DOCUMENTS

| JP | 3-206698 | * | 9/1991 | .................. 29/739 |
| JP | 5-175695 | * | 7/1993 | .................. 29/739 |

* cited by examiner

Primary Examiner—A. Dexter Tugbang
(74) Attorney, Agent, or Firm—Darby & Darby

(57) ABSTRACT

An electronic parts-mounting apparatus including a rotating vertical shaft and at least one mounting head arranged around the vertical shaft has a lift cam mechanism that operates to lift and lower an associated one of the at least one mounting head as each mounting head is rotated with the vertical shaft. The lift cam mechanism includes a cylindrical cam having an annular protruding portion concentrically disposed with respect to the vertical shaft that provides upper and lower cam surfaces. Upper and lower rolling cam followers are arranged respectively on the upper and lower cam surfaces of the protruding portion to sandwich the protruding portion therebetween. One end of a support member has one of the upper and lower cam followers mounted thereon and the other end of the support member has the associated one of the at least one mounting head connected thereto. The support member has one end of a leaf spring fixed to it and the movable free end of the leaf spring has the other of the upper and lower cam followers mounted thereon, for urging the cam follower toward the protruding portion of the cylindrical cam.

5 Claims, 3 Drawing Sheets

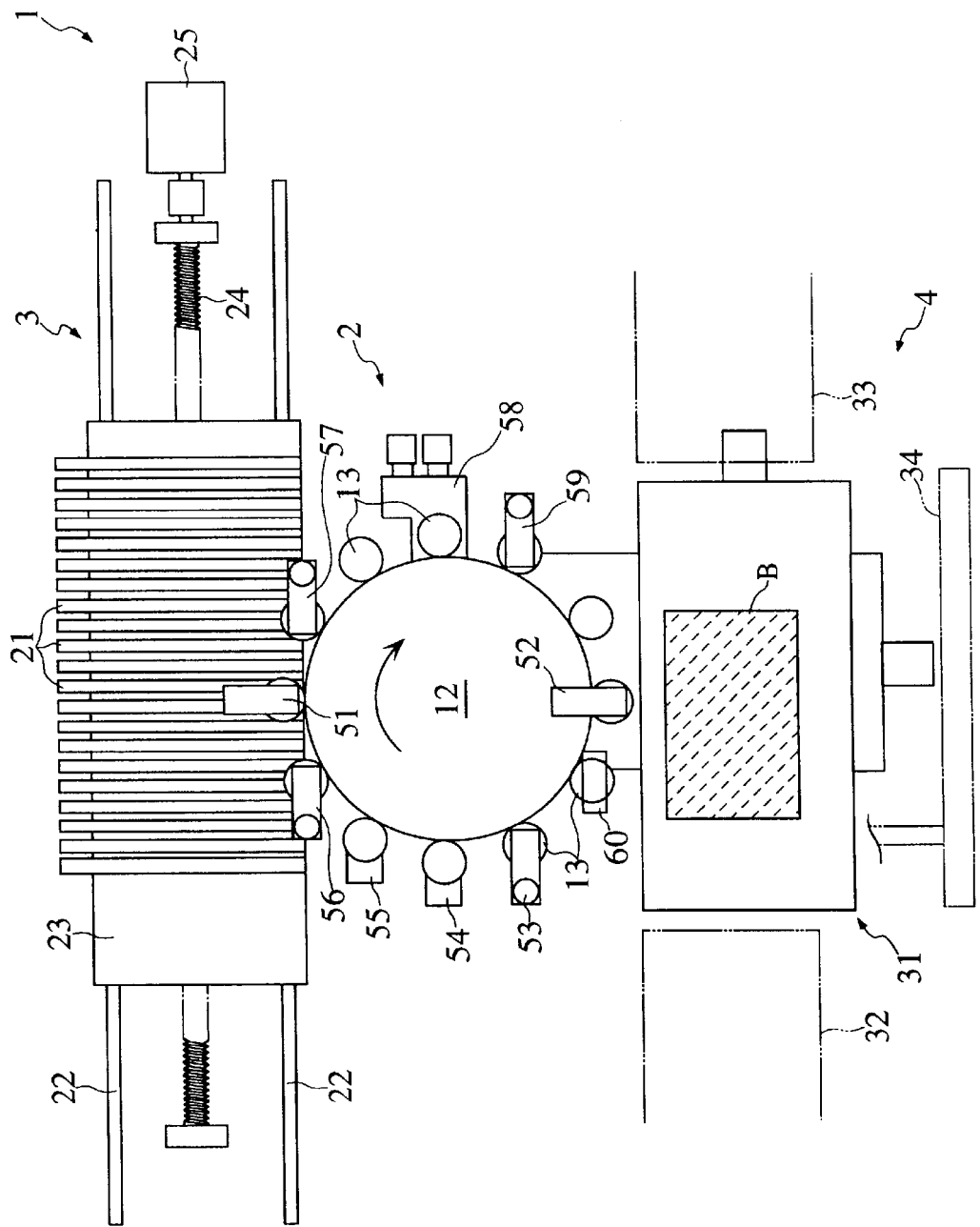

FIG. 3A
FIG. 3B
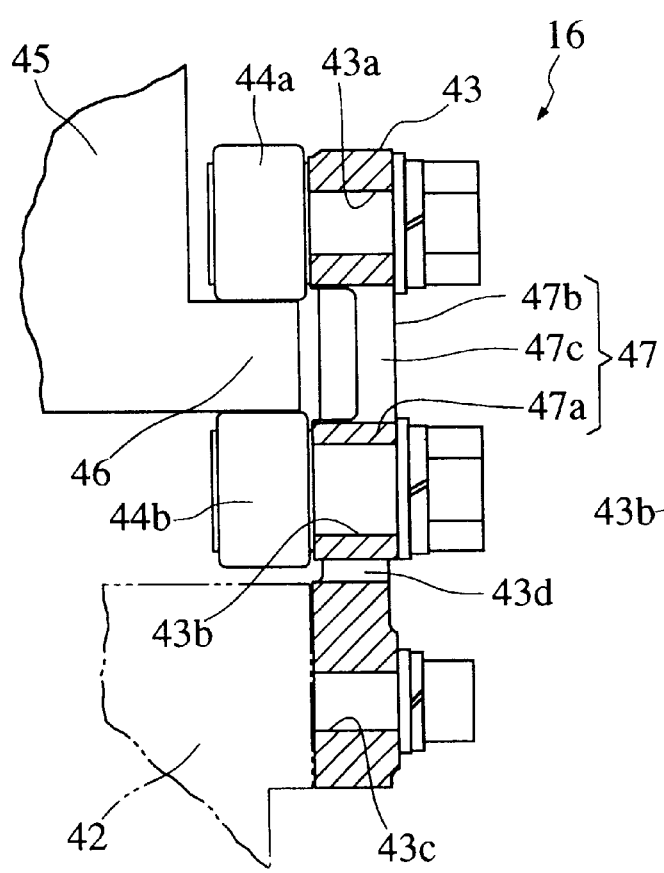
(a)
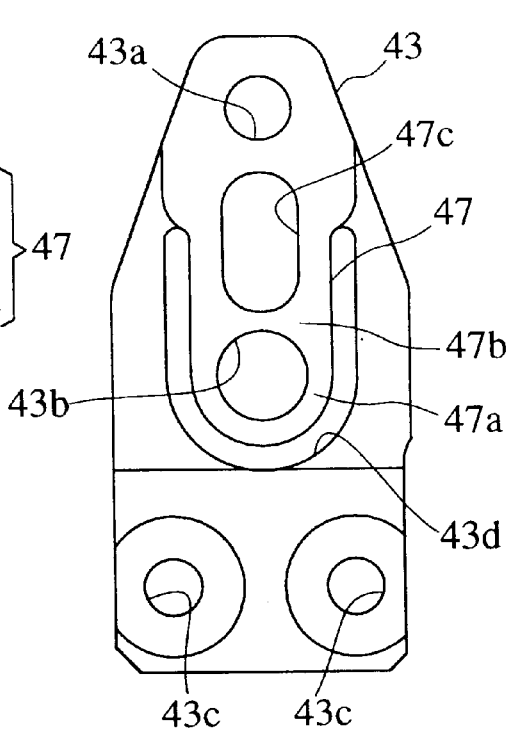
(b)

LIFT CAM MECHANISM FOR ELECTRONIC PARTS MOUNTING APPARATUS

"This is a division, of application Ser. No. 09/017,637, filed Feb. 2. 1998, now U.S. Pat. No. 6,061,900. The prior application is hereby incorporated herein by reference, in its entirety."

BACKGROUND OF THE INVENTION

1. Field of the Invention

This invention relates to a lift cam mechanism for an electronic parts-mounting apparatus, which lifts and lowers a mounting head which is moved about a vertical shaft to pick up and mount electronic parts.

2. Prior Art

Conventionally, an electronic parts-mounting apparatus of this kind has been proposed e.g. by Japanese Laid-Open Patent Publication (Kokai) No. 5-175695, in which an index unit, which forms a main part of a driving system of the apparatus, intermittently rotates a rotary table formed in a manner suspended from the index unit to thereby bring each mounting head arranged on the outer periphery of the rotary table to a suction station and a mounting station, while each mounting head is lifted and lowered to pick up an electronic part at the suction station by vacuum and mount the same on a circuit board at the mounting station. Each electronic part is picked up by vacuum from a pick-up point at the suction station and mounted at a mounting point at the mounting station. The pick-up point and the mounting point are different in level. Therefore, apart from being lifted and lowered directly for picking up and mounting electronic parts, the mounting head is progressively lifted and lowered by the lift cam mechanism comprised of a ribbed cylindrical cam disposed on the index unit side and cam followers fixed to the mounting head, as the mounting head is moved about a vertical shaft by intermittent rotation of the rotary table.

More specifically, a pair of upper and lower cam followers (roller followers) engage with a rib portion of the ribbed cylindrical cam such that the rib portion is interposed between the upper and lower cam followers in a manner rollable thereon, and the mounting head is suspended from a holder holding the cam followers, by way of a suspension member. The upper one of the cam followers is directly and rotatably fitted through the holder, whereas the lower one is rotatably fitted through a distal end of a swing arm pivotally or swingably mounted in the holder and at the same time urged toward the rib portion of the ribbed cylindrical cam by a coil spring interposed between and the swing arm and the holder. The coil spring ensures the reliable operation of the lift cam mechanism, and accommodates variations in thickness among individual rib portions formed on respective ribbed cylindrical cams and changes in thickness at a sloped portion of the rib portion of a particular cylindrical cam to thereby enable the cam followers to smoothly roll on the rib portion of the ribbed cylindrical cam.

The lift cam mechanism of the proposed electronic parts-mounting apparatus described above, however, suffers from the problem that a swinging stroke of the swing arm is very small and hence lubricant at a support shaft of the swing arm is liable to become short (since lubricant is difficult to spread over the whole peripheral surface of the support shaft), which often results in degraded durability of the swing arm and faulty following operation of the cam followers. Further, if there remain burrs at a portion of the swing arm pivotally fitted on the support shaft, the swing arm swings to an excessive extent, which can also cause the faulty following operation of the cam followers. As the apparatus operates at a higher speed, the faulty following operation of the cam followers comes to act on the mounting head as a shock, causing displacement or deviation in position of an electronic part picked up by the mounting head.

SUMMARY OF THE INVENTION

It is the object of the invention to provide a lift cam mechanism for an electronic parts-mounting apparatus, which is simple in construction and improved in durability, and capable of preventing the faulty following operation of cam followers following a cylindrical cam.

To attain the above object, the present invention provides a lift cam mechanism for an electronic parts-mounting apparatus including a vertical shaft and at least one mounting head arranged around the vertical shaft, the lift cam mechanism operating to lift and lower an associated one of the at least one mounting head as each mounting head is moved about the vertical shaft.

The lift cam mechanism according to the invention is characterized by comprising:

a cylindrical cam concentrically disposed with respect to the vertical shaft, the cylindrical cam having a protruding portion formed on a peripheral surface thereof in a manner such that the protruding portion has a generally annular shape and provides upper and lower cam surfaces;

a pair of upper and lower cam followers arranged respectively on the upper and lower cam surfaces of the protruding portion in a manner such that the pair of upper and lower cam followers sandwich the protruding portion therebetween in a manner rollable thereon;

a support member having one end and another end, the one end of the support member having one of the pair of upper and lower cam followers fitted therethrough and the another end of the support member having the associated one of the at least one mounting head connected thereto; and a leaf spring having one end and another end, the one end of the leaf spring being fixed to the support member and the another end of the leaf spring having another of the pair of upper and lower cam followers fitted therethrough, for urging the another of the pair of upper and lower cam followers toward the protruding portion of the cylindrical cam.

According to this lift cam mechanism, the leaf spring urges one of the pair of upper and lower cam followers toward the cylindrical cam. Therefore, the one cam follower can be directly mounted through the leaf spring. That is, component parts of the lift cam mechanism conventionally formed by respective two separate members, i.e. a swing arm and a coil spring, can be formed by a single leaf spring, which makes it possible to eliminate a pivotally fixed portion of the swing arm for pivotal movement thereof. As a result, the pivotally fixed portion, which presents a problem of durability of the lift cam mechanism can be eliminated, and the loss of following operation occurring between component parts of the driving-force transmitting system of the cam mechanism can be minimized since the number of these component parts can be reduced.

Preferably, the leaf spring is integrally formed with the support member.

According to this construction, the number of the component parts of the lift cam mechanism can be further reduced and the leaf spring can be easily formed.

More preferably, the support member and the leaf spring are formed by a single plate member opposed to the protruding portion of the cylindrical cam, the support member being a thick portion of the plate member, while the leaf spring being a tongue-shaped portion of the plate member, which is formed by cutting a U-shaped cutout through the plate member and has a tip-side portion formed with a fitting portion through which the another of the pair of upper and lower cam followers is fitted and a root-side portion being processed by grinding to a reduced thickness to form a spring portion.

According to this preferred embodiment, the leaf spring can be integrally formed with the support member from a single plate member which is disposed opposed to the protruding portion of the cylindrical cam. Therefore, the leaf spring can be easily formed without bending a fitting portion through which a cam follower is mounted.

Further preferably, the root-side portion of the leaf spring has a central portion formed with a slot.

According to this preferred embodiment, it is possible to easily set a spring coefficient of the spring portion of the leaf spring.

Further preferably, the one end of the support member is formed with a through hole through which the one of the pair of upper and lower cam followers is fitted, the fitting portion of the leaf spring through which the another of the pair of upper and lower cam followers is fitted being a through hole.

Further preferably, the one of the pair of upper and lower cam followers is an upper cam follower placed on an upper one of the upper and lower cam surfaces of the protruding portion of the cylindrical cam.

Preferably, the electronic parts-mounting apparatus includes a support table, an index unit mounted on the support table and having an output shaft, a rotary table fixed to the vertical shaft, the vertical shaft being integrally formed with the output shaft of the index unit, the cylindrical cam being fixed to the support table.

More preferably, the lift cam mechanism includes at least one bracket vertically movably mounted on the rotary table, the at least one bracket having the at least one mounting head respectively fixed thereto and each connecting the support member to the associated one of the at least one mounting head.

The above and other objects, features, and advantages of the invention will become more apparent from the following detailed description taken in conjunction with the accompanying drawings.

BRIEF DESCRIPTION OF THE DRAWINGS

FIG. 2 is a plan view of the electronic parts-mounting apparatus incorporating the lift cam mechanism according to the embodiment;

FIG. 3A is a side view showing a structure of the lift cam mechanism and component parts associated therewith, according to the embodiment; and FIG. 3B is a plan view of a holder appearing in FIG. 3B.

DETAILED DESCRIPTION

Figure 1:
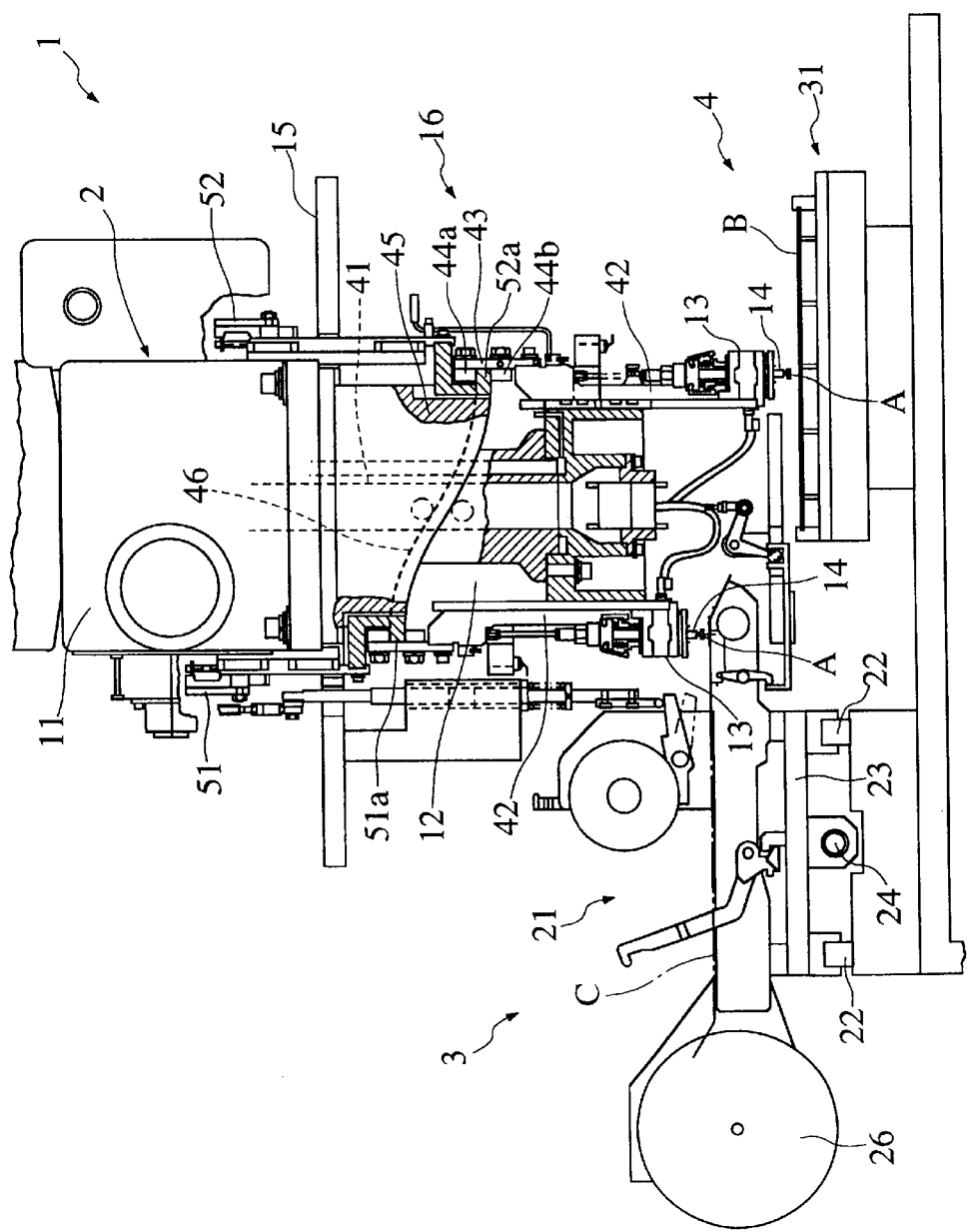
FIG. 1 is a front elevation of an electronic parts-mounting apparatus incorporating a lift cam mechanism according to an embodiment of the invention.

The invention will now be described in detail with reference to drawings showing an embodiment thereof. In the embodiment, a lift cam mechanism according to the invention is applied to an electronic parts-mounting apparatus.

Referring first to FIGS. 1 and 2, there is shown an electronic parts-mounting apparatus which includes a main unit 2, a feeding section 3 for feeding electronic parts A, and a mounting section 4 for mounting the electronic parts A on a circuit board B, with the feeding section 3 and the mounting section 4 being arranged on opposite sides of the main unit 2 in a manner parallel to each other. The main unit 2 is comprised of an index unit 11 which forms a main part of the driving system of the apparatus, a rotary table 12 coupled thereto, and a plurality of (twelve, in the present embodiment) mounting heads 13 arranged on the outer periphery of the rotary table 12. The rotary table 12 is intermittently rotated by the index unit 11 in angular increments corresponding to the number of the mounting heads 13. With intermittent rotation of the rotary table 12, a selected one of suction nozzles 14 carried by each mounting head 13 is properly brought to the feeding section 3 and the mounting section 4, whereby each selected suction nozzle 14 picks up an electronic part A supplied at the feeding section 3 by vacuum, carries the same to the mounting section 4 through intermittent rotation of the rotary table 12, and mounts the same on the circuit board B supplied at the mounting section 4.

The feeding section 3 has tape cassettes 21 corresponding in number to the number of kinds of electronic parts A to be mounted on the circuit board B. The tape cassettes 21 are removably mounted on a feed table 23 in parallel with each other perpendicularly to the directions of forward/backward movements of the feed table 23. The feed table 23 is slidably guided by a pair of guide rails 22, 22. A ball screw 24 extends through the feed table 23 in a direction of its sliding on the guide rails, whereby the feed table 23 is moved forward and backward by respective normal and reverse rotations of a feed motor 25 connected to one end of the ball screw 24, to selectively bring a selected one of the tape cassettes 21 to a suction station for the mounting heads 13. Each tape cassette 21 contains a roll of a carrier tape C which carries electronic parts A thereon at intervals of a predetermined pitch and is wound around a tape reel 26, and the electronic parts A are sequentially picked up by a corresponding one of the suction nozzles 14 by vacuum as the carrier tape C is unwound from the tape reel 26.

The mounting section 4 is comprised of an X-Y table 31 for moving the circuit board B placed thereon in the directions of an X axis and a Y axis, a feed conveyor 32 and a delivery conveyor 33 arranged to face respective opposite longitudinal ends of the X-Y table 31, and a circuit board transfer device 34 for transferring a circuit board B on the feed conveyor 32 onto the X-Y table 31 and at the same time transferring a preceding circuit board B already placed on the X-Y table onto the delivery conveyor 33. That is, the circuit board B sent to a downstream end of the feed conveyor 32 is transferred by the circuit board transfer device 34 onto the X-Y table 31, and at the same time, the circuit board B having the electronic parts A mounted thereon is transferred by the circuit board transfer device 34 onto the delivery conveyor 33. The circuit board B placed on the X-Y table 31 is moved to its predetermined positions by the X-Y table 31 such that specific portions thereof are sequentially brought to a mounting station for the mounting heads, at which each electronic part held at a selected suction nozzle 14 of each mounting head 13 is mounted at its specific portion of the circuit board.

The index unit 11 of the main unit 2, which forms the main part of the whole driving system of the apparatus, is supported by a support table 15. The index unit 11 intermittently rotates the rotary table 12, and at the same time causes various devices mounted on the main unit 2 to operate in a manner synchronous with a repetition period of intermittent rotation of the rotary table 12.

The rotary table 12 is rigidly mounted on a vertical shaft 41 integrally formed with an output shaft of the index unit 11 and extending perpendicularly downward therefrom and is driven for clockwise intermittent rotation as viewed in FIG. 2. The twelve mounting heads 13 arranged at circumferential intervals along the periphery of the rotary table 12 are fixed to respective brackets 42 vertically movably mounted on the periphery of the rotary table 12. In the present embodiment, the rotary table 12 performs twelve intermittent rotations or index motions to make one complete rotational turn in a manner corresponding to the number of mounting heads 13. The mounting heads 13, which intermittently move about the rotation axis of the rotary table 12, are sequentially brought to twelve stations including the suction station in the feeding section, at which electronic parts are picked up by vacuum by respective selected suction nozzles 14, and the mounting station in the mounting section, at which the picked electronic parts are sequentially mounted on a circuit board.

Each mounting head 13 carries a plurality of (five, in the present embodiment) suction nozzles 14 arranged at circumferentially equal intervals on the periphery thereof such that a selected one of the suction nozzles 14 can be extended downward and retracted upward and the suction nozzles 14 as a whole can be moved about a vertical axis of the mounting head 13. A suitable suction nozzle can be selected from the five suction nozzle 14, which corresponds to the size and other features of a required electronic part A. This selection of the suitable suction nozzle 14 is carried out by moving the selected suction nozzle 14 about the vertical axis of the mounting head 13 to a nozzle-setting position and causing the same to project out. The five suction nozzles 14 are constructed such that they can be removed from the mounting head 13 for replacement as desired.

Each of the above-mentioned brackets 42 has a holder (support member) 43 fixed to an upper end thereof, which has a pair of upper and lower cam followers 44a, 44b fitted therethrough. The support table 15 has a ribbed cylindrical cam 45 in the form of a hollow cylinder fixed to the underside thereof, and a rib portion (protruding portion) 46 which provides upper and lower cam surfaces is formed around a lower end of the ribbed cylindrical cam. The pair of upper and lower cam followers 44a, 44b engage with the rib portion 46. That is, they are arranged on the upper and lower cam surfaces of the rib portion 46, respectively, such that the upper and lower cam followers 44a, 44b sandwich the rib portion 46 therebetween in a manner rollable thereon. The pair of upper and lower cam followers 44a, 44b, the ribbed cylindrical cam 45 (particularly the rib portion 46 thereof), and other members associated with them constitute a lift cam mechanism 16 for lifting and lowering the mounting heads 13 according to the embodiment of the invention. With intermittent rotation of the rotary table 12, the bracket 42 and the mounting head 13 fixed thereto rotate, which causes the cam followers 44a, 44b to roll on the rib portion 46, whereby the mounting head 13 is lifted and lowered according to the cam profile of the rib portion 46 of the ribbed cylindrical cam 45. More specifically, the mounting point of each mounting head 13 in the mounting station is lower in level than the pick-up point of the same in the suction station, so that the mounting head 13 is slowly or progressively lifted as it moves toward the suction station, while it is slowly or progressively lowered as it moves toward the mounting station.

On the other hand, various devices are arranged at stations where the mounting heads 13 are stopped according to the intermittent rotation of the rotary table 12, including the suction station and the mounting station, for accessing the mounting heads 13.

At the suction station, a mounting head-lifting/lowering device 51 is arranged for engagement with the cam followers 44a, 44b fitted through the holder 43 to thereby disconnect the cam followers 44a, 44b from the rib portion 46 and then operate to lower the mounting head 13, for the picking up of an electronic part A by the suction nozzle 14. At the mounting station, a mounting head-lifting/lowering device 52 is arranged similarly for lowering the mounting head 13 to mount the electronic part A on the circuit board B. More specifically, portions of the rib portion 46 of the ribbed cylindrical cam 45 corresponding respectively to the mounting station and the suction station are cut out to form discontinued portions, and in the cut-out or discontinued portions, engaging portions 51a, 52a of the respective mounting head-lifting/lowering devices 51, 52 are vertically movably fitted for engagement with the cam followers 44a, 44b which are to be disengaged from the rib portion 46. The mounting head-lifting/lowering devices 51, 52 are identical in the basic construction except for their different arm lengths.

Further, as shown in FIG. 2, at a station which is clockwise second next to the mounting station as viewed in FIG. 2, a nozzle selector 53 is arranged which moves the suction nozzles 14 about the vertical axis of the mounting head 13 to thereby bring a suction nozzle 14 selected for operation to a nozzle-setting position at an outer location of the mounting head 13. At the following station, a nozzle projector/retractor 54 is arranged which lowers the mounting head 13 until it strikes a stopper, not shown, to thereby cause suction nozzles 14 which are not selected for operation to retract, and lifts the mounting head 13 to cause the selected suction nozzle 14 to project downward therefrom. At the following station, a nozzle length-adjusting device 55 is arranged which adjusts the length of projected part of the suction nozzle 14.

Similarly, at the following station which immediately precedes the suction station, a nozzle position-correcting device 56 is arranged which moves the suction nozzle 14 about the vertical axis of the mounting head 13 to thereby correct the position of the suction nozzle 14 which is to be brought to the suction station, in a transverse direction, i.e. in a direction perpendicular to the directions of forward/backward movements of the feed table 23. At a station following the suction station, a nozzle-returning device 57 is arranged which moves the suction nozzle 14 about the vertical axis of the mounting head 13 to thereby return the suction nozzle 14 to its original nozzle-setting position. At a station which is second next to the station following the suction station, a part-recognizing device 58 is arranged which recognizes an orientation (on a horizontal plane) of the electronic part A held at the suction nozzle based on a sensed image thereof, and at the following station, a part angle-correcting device 59 is arranged which moves the suction nozzle 14 about the vertical axis of the mounting head 13 based on results of recognition of the electronic part A by the part-recognizing device 58, to thereby correct the orientation or attitude of the electronic part A held at the suction nozzle 14 such that it is suitable for mounting of the same.

Further, at a station following the mounting station, a part-discharging device 60 is arranged for removing an electronic part A, the position or orientation of which is determined by the part-recognizing device 58 to be uncorrectable and hence mounting of which is canceled, from the suction nozzle 14.

Now, a sequence of the whole operation of the main unit 2 will be briefly described by taking operations of one of the mounting heads 13 as an example. After the mounting head 13 has mounted an electronic part A on the circuit board B at the mounting station, the mounting head 13 is intermittently moved about the rotation axis of the rotary table 12 toward the suction station by intermittent rotation of the rotary table 12. Before the mounting head 13 reaches the suction station, selection of a suction nozzle 14, projection/retraction of the suction nozzles 14, adjustment of a projected part of the selected suction nozzle 14, and correction of the position of the selected suction nozzle 14 are sequentially effected based on control commands for the mounting head 13. On the other hand, in the feeding section 3, as the mounting head 13 is moved from the station immediately preceding the suction station to the suction station, the feed table 23 is moved forward or backward to bring one of the tape cassettes 21 which corresponds to the selected suction nozzle 14, to the suction station based on a control command.

The mounting head 13 picks up an electronic part A by vacuum at the suction station, and now is moved about the rotation axis of the rotary table 12 toward the mounting station. Before the mounting head 13 reaches the mounting station, returning of the suction nozzle 14 to the original nozzle-setting position, recognition of the electronic part A picked up, and correction of angle or orientation of the electronic part A based on results of the recognition are sequentially effected based on respective control commands. On the other hand, in the mounting section, as the mounting head 13 is moved from the station immediately preceding the mounting station to the mounting station, the X-Y table 31 is moved based on a control command, thereby bringing a portion of the circuit board B at which the electronic part A is to be mounted to the mounting station. Then, the mounting head-lifting/lowering device 52 lowers the mounting head 13 to thereby cause the electronic part A to be mounted on the circuit board B.

Next, the above-mentioned lift cam mechanism 16 will be described in detail with reference to FIGS. 3A and 3B. As shown in the figures, the pair of cam followers 44a, 44b linked to the mounting head 13, that is, the upper cam follower 44a and the lower cam follower 44b engage with the rib portion (protruding portion) 46 of the ribbed cylindrical cam 45 such that they are in rolling contact with the upper and lower cam surfaces of the rib portion 46. The rib portion 46 protrudes in the form of a rib around the lower end of the ribbed cylindrical cam 45 with uniform thickness, and has a contour curve which causes the mounting head 13 to be lifted as it is moved toward the suction station, and lowered as it is moved toward the mounting station.

The upper cam follower 44a and the lower cam follower 44b are so-called roller followers and rotatably fitted through the holder 43. The holder 43 is formed of a rectangular thick plate opposed to the rib portion 46. The holder 43 has an upper portion thereof formed with a first fitting hole 43a for fitting the upper cam follower 44a therethrough, an intermediate portion thereof formed with a second fitting hole 43b for fitting the lower cam follower 44b therethrough, and a lower portion thereof formed with a pair of through holes 43c, 43c for fastening the holder 43 to the bracket 42 by screws.

Further, the intermediate portion of the holder 43 is formed with a U-shaped cutout 43d such that an arcuate portion of the U-shaped cutout 43d surrounds the second fitting hole 43b. A portion defined by the U-shaped cutout 43d provides a leaf spring 47 tongue-shaped and integrally formed with the holder 43, which has a fitting portion 47a enclosing the second fitting hole 43b on a tip side thereof, and a spring portion 47b on a root side of the same. The spring portion 47b is formed thin by removing a rib portion-side half, in cross-section, of a portion of the leaf spring 47, which is opposed or corresponds to the rib portion 46, by grinding, and has a slot 47c formed through an intermediate portion thereof, for adjustment of a spring force (spring constant) of the leaf spring 47.

In a state in which the upper cam follower 44a and the lower cam follower 44b are fitted through the holder 43 constructed as described above and the resulting assembly is set on the rib portion 46, the lower cam follower 44b is urged toward the rib portion 46 by the leaf spring (spring portion 47b) 47, whereby the rib portion 46 is held between the upper and lower cam followers 44a, 44b. Therefore, as each mounting head 13 is moved about the rotation axis of the rotary table 12, the upper and lower cam followers 44a, 44b roll on the rib portion 46, whereby changes in thickness at a sloped portion (bend) of the rib portion 46 and variations in thickness of the rib portion 46 per se are accommodated by the leaf spring 47 to thereby lift and lower the mounting head 13 in a smooth and accurate manner.

It should be noted that since the leaf spring 47 extends not in a direction tangential to the outer peripheral surface of the rib portion 46 (the ribbed cylindrical cam 45) but in a direction parallel to the axis of the same, when the leaf spring 47 is bent, the lower cam follower 44b is caused to be inclined. However, the upper and lower cam followers 44a, 44b are actually formed such that they are convex in periphery or barrel-shaped, through not explicitly shown, and hence even when the lower cam follower 44b is inclined, rolling resistance is not increased. It is possible, however, to form the leaf spring 47 such that it extends in the direction tangential to the outer peripheral surface of the rib portion 46 (ribbed cylindrical cam 45). In such a case, it is required to form the fitting portion 47a by twisting the same at right angles to the spring portion 47b. Alternatively, the spring portion 47b and the fitting portion 47a are required to be formed as separate members.

As described above, according to the present embodiment, urging means for urging the lower cam follower 44b toward the rib portion 46 is not formed by a swing arm and a coil spring as in the prior art but formed by a single leaf spring, whereby the structure of the lift cam mechanism can be simplified. Further, the urging means does not have a portion pivotally fixed to the holder as the swing arm employed in the prior art does, which makes it possible to eliminate the problems of the faulty following operation of the cam followers and degraded durability of the pivotally fixed portion, which are caused by shortage of lubricant or existence of burrs. Moreover, according to the present embodiment, changes in the thickness of the rib portion 46 are accommodated not by the coil spring by way of the swing arm but by the leaf spring 47 directly, so that a loss of load due to the transmission of the same between the members is reduced to thereby enable the following performance of the lift cam mechanism to be enhanced. As a result, the upper and lower cam followers 44a, 44b smoothly roll on the rib portion 46, whereby it is possible to effectively prevent the occurrence of a shock during rolling of the upper and lower cam followers 44a, 44b on the rib portion 46.

Moreover, the leaf spring 47 is integrally formed with the holder 43 and hence not only the number of component parts of the lift cam mechanism but also the man-hour for assembly of the same can be reduced. That is, the lift cam mechanism can be designed compact and manufactured at reduced costs.

Although the leaf spring 47 is integrally formed with the holder (support member) 43 in the present embodiment, the leaf spring 47 may be formed as a separate member and fixed to the holder 43.

As described above, according to the lift cam mechanism for the electronic parts-mounting apparatus of the invention, portions having a poor durability such as a pivotally-fixed portion can be eliminated, and loss of following operation occurring between the component parts can be minimized since the number of component parts of the driving force-transmitting system of the cam mechanism can be reduced. Therefore, the lift cam mechanism can be improved in durability or service life by virtue of simplified construction thereof and at the same time the faulty following of the cam followers on the cam profile or rib portion can be minimized, which enables the cam followers to smoothly roll on the rib portion of the ribbed cylindrical cam to thereby smoothly lift and lower the mounting heads. This effectively prevents deviation of an electronic part picked up by the suction nozzles from its proper position. That is, the reliability of the electronic parts-mounting apparatus can be improved.

It is further understood by those skilled in the art that the foregoing are preferred embodiments of the invention, and that various changes and modification may be made without departing from the spirit and scope thereof.

What is claimed is:

1. An electronic parts mounting apparatus comprising:
   a rotating vertical shaft;
   at least one mounting head arranged around and rotating with said vertical shaft;
   a lift cam mechanism operating to lift and lower an associated one of said at least one mounting heads as each mounting head is moved by said rotating vertical shaft, the lift cam mechanism comprising:
      a cylindrical cam concentrically disposed with respect to said vertical shaft, said cylindrical cam having a protruding portion formed on a peripheral surface thereof with said protruding portion having a generally annular shape and providing upper and lower cam surfaces;
      upper and lower rollable cam followers arranged respectively on said upper and lower cam surfaces of said protruding portion to sandwich said protruding portion therebetween with said cam followers being rollable on said cam surfaces;
      a support member having a first end and a second end, said second end of said support member being mounted to said at least one mounting head and said upper rollable cam follower being mounted on said first end of said support member so as to contact said upper surface of said protruding portion of said cylindrical cam, and
      a leaf spring having a first end and a freely movable second end, said first end of said leaf spring being fixed to said first end of said support member and said lower rollable cam follower being mounted on end of said leaf spring for urging said lower rollable cam follower toward said lower surface of said protruding portion of said cylindrical cam.

2. The electronic parts mounting apparatus according to claim 1, wherein said leaf spring is integrally formed with said support member.

3. The electronic parts mounting apparatus according to claim 1, wherein said electronic parts-mounting apparatus includes a support table, an index unit mounted on said support table and having an output shaft, a rotary table fixed to said vertical shaft, said vertical shaft being integrally formed with said output shaft of said index unit, said cylindrical cam being fixed to said support table.

4. The electronic parts mounting apparatus according to claim 3, wherein said lift cam mechanism includes at least one bracket vertically movably mounted on said support table, said at least one bracket having said at least one mounting head respectively fixed thereto and each connecting said support member to said associated one of said at least one mounting head.

5. The electronic parts mounting apparatus according to claim 2 wherein said leaf spring and said support member are made from a single plate member.

* * * * *